(12) United States Patent
Morishita

(10) Patent No.: US 11,528,441 B2
(45) Date of Patent: Dec. 13, 2022

(54) SOLID-STATE IMAGING DEVICE, AD-CONVERTER CIRCUIT AND CURRENT COMPENSATION CIRCUIT

(71) Applicant: RENESAS ELECTRONICS CORPORATION, Tokyo (JP)

(72) Inventor: Fukashi Morishita, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/540,925

(22) Filed: Dec. 2, 2021

(65) Prior Publication Data

US 2022/0210364 A1 Jun. 30, 2022

(30) Foreign Application Priority Data

Dec. 24, 2020 (JP) .............................. JP2020-215940

(51) Int. Cl.
*H04N 5/3745* (2011.01)
*H03M 1/06* (2006.01)
*H04N 5/378* (2011.01)

(52) U.S. Cl.
CPC ......... *H04N 5/37455* (2013.01); *H04N 5/378* (2013.01); *H04N 5/37457* (2013.01)

(58) Field of Classification Search
None
See application file for complete search history.

(56) References Cited

U.S. PATENT DOCUMENTS

2020/0244908 A1   7/2020  Matsumoto et al.
2020/0389617 A1*  12/2020  Totsuka ............. H04N 5/37455

FOREIGN PATENT DOCUMENTS

JP          2020-120310 A       8/2020

* cited by examiner

*Primary Examiner* — Mark T Monk
(74) *Attorney, Agent, or Firm* — McDermott Will & Emery LLP

(57) ABSTRACT

It is an object of the present invention to provide a technique for reducing the variation of a bias voltage.
An analog-to-digital converter comprises a comparator including a first amplifier and a second amplifier inputted one output of the first amplifier. The first amplifier is a differential type of amplifier, and includes one input terminal for receiving a signal and the other input terminal for receiving a reference signal which changes with a predetermined slope. The second amplifier is a single-ended type amplifier, and determines an auto zero voltage based on the amplified voltage by an auto zero operation of the first amplifier and includes a self-bias circuit using the auto zero voltage as a bias voltage. The comparator is plural, the comparators are plurality which arranged in a row direction, and outputs a digital value based on an analog voltage inputted to the other input terminal in parallel operation.

13 Claims, 17 Drawing Sheets

SOLID-STATE IMAGING DEVICE, AD-CONVERTER CIRCUIT AND CURRENT COMPENSATION CIRCUIT

CROSS-REFERENCE TO RELATED APPLICATIONS

The disclosure of Japanese Patent Application No. 2020-215940 filed on Dec. 24, 2020 including the specification, drawings and abstract is incorporated herein by reference in its entirety.

BACKGROUND

The present disclosure relates to a solid-state imaging device, and the present disclosure is applicable to, for example, an analog-to-digital converter of a solid-state imaging device.

The Background of the Invention

The solid-state imaging device has pixel arrays in which a plurality of pixels is arranged in a matrix. Each column of the pixel array is provided with a vertical signal line. CMOS (Complementary Metal Oxide Semiconductor) image sensor is an exemplary solid-state imaging device. For CMOS image sensors, each pixel includes at least one photoelectric conversion element and an amplifying transistor that outputs an electric signal (luminance signal) corresponding to charges accumulated in the photoelectric conversion element to the vertical signal line.

In CMOS image sensors, additional a column circuit is provided for each column of the pixel array. Each column circuits are provided with AD-converter circuit (hereinafter referred to as analog-to-digital converter) for converting electric signals of the corresponding pixel into digital signals.

A comparator used for the analog-to-digital converter compares and judges a luminance signal voltage and a reference voltage output from pixel via the vertical signal line. Generally, the comparator is composed of several stages of amplifiers, for example, in a two-stage amplifier configuration, the low-speed signal-compare operation is performed at the first stage of amplifier, the operation band is narrowed, and gain-up is performed at the second stage of amplifier. In addition, the amplifier is provided with a current source transistor, and the control electrodes of the respective current source transistors are provided with a bias voltage from a common-bias circuit.

There are disclosed techniques listed below.
[Patent Document 1] Japanese Unexamined Patent Application Publication 2020-120310

Patent Document 1 discloses amplifier are provided with a bias voltage from a common-bias circuit.

SUMMARY

However, when a large number of the analog-to-digital converter operate in parallel, for example, the bias voltage may fluctuate due to noise on a common-bias line supplying the bias voltage to the amplifier of the second stage of each analog-to-digital converter.

Other objects and novel features will become apparent from the description of this specification and the accompanying drawings.

An outline of representative ones of the present disclosure will be briefly described below.

That is, an analog-to-digital converter comprise a comparator including a first amplifier and a second amplifier inputted one output of the first amplifier. The first amplifier is a differential type of amplifier, and includes one input terminal for receiving a signal and the other input terminal for receiving a reference signal which changes with a predetermined slope. The second amplifier is a single-ended type amplifier. The second amplifier determines an auto zero voltage based on the amplified voltage by an auto zero operation of the first amplifier and includes a self-bias circuit using the auto zero voltage as a bias voltage. And the comparator is plural, the comparators are plurality which arranged in a row direction, and outputs a digital value based on an analog voltage inputted to the other input terminal in parallel operation.

According to the present disclosure, variations in the bias voltage can be reduced.

BRIEF DESCRIPTION OF THE DRAWINGS

FIG. 7 is a diagram illustrating a state in which a AZ-switch of a first amplifier and a second amplifier are turned on.

FIG. 8 is a diagram illustrating a state in which the AZ switch of the first amplifier is turned off and the AZ switch of the second amplifier is turned on.

DETAILED DESCRIPTION

Figure 1:
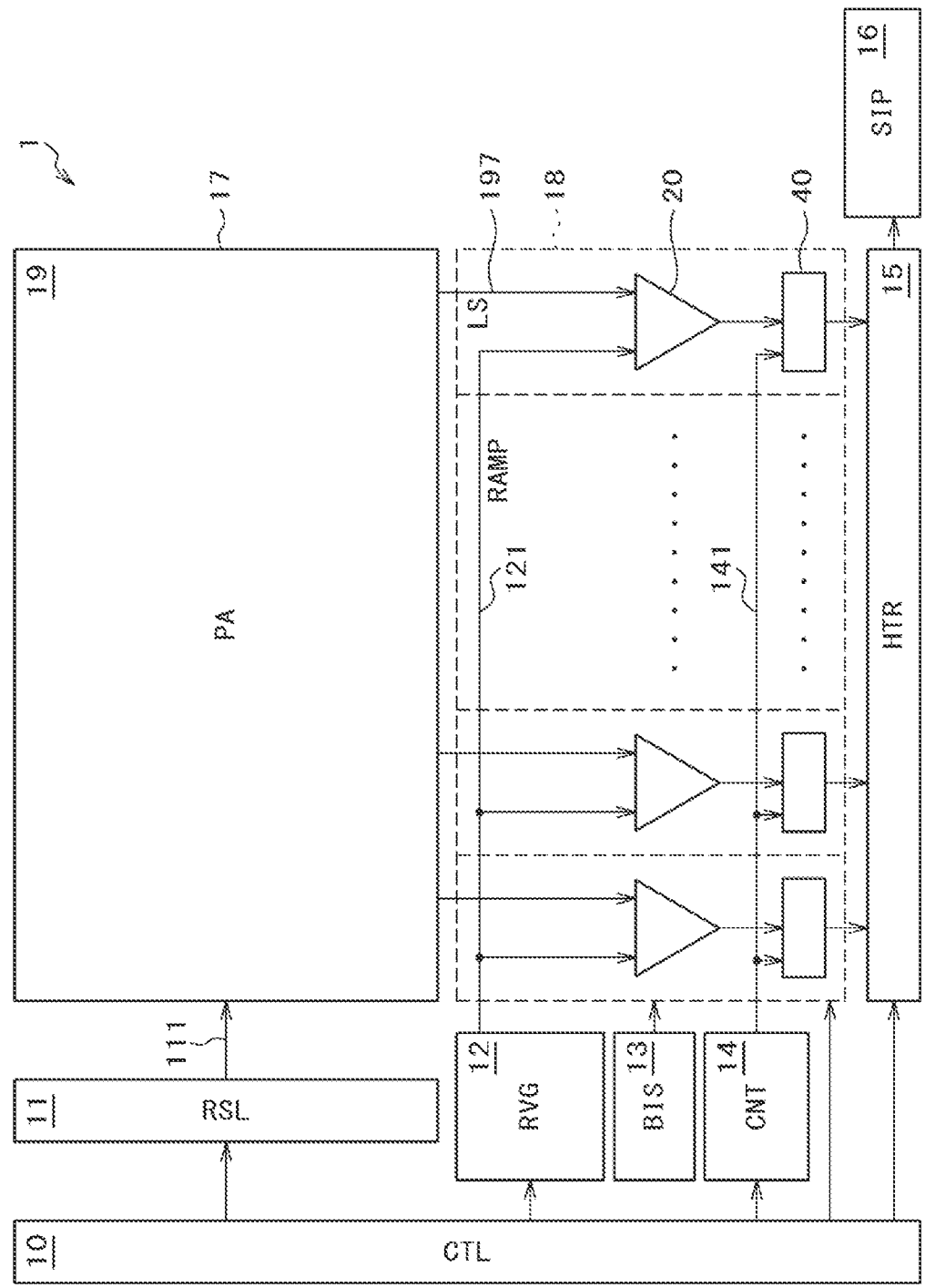
FIG. 1 is a configuration diagram illustrating a solid-state imaging device according to an embodiment.

Embodiments will be described below with reference to the drawings. For clarity of explanation, the following description and drawings are appropriately omitted and simplified. In the following description, the same components element is denoted by the same reference numerals, and a repetitive description thereof may be omitted. It should be noted that the drawings may be represented schematically for the sake of clarity of explanation, but are merely an example and do not limit the interpretation of the present disclosure.

Figure 15:
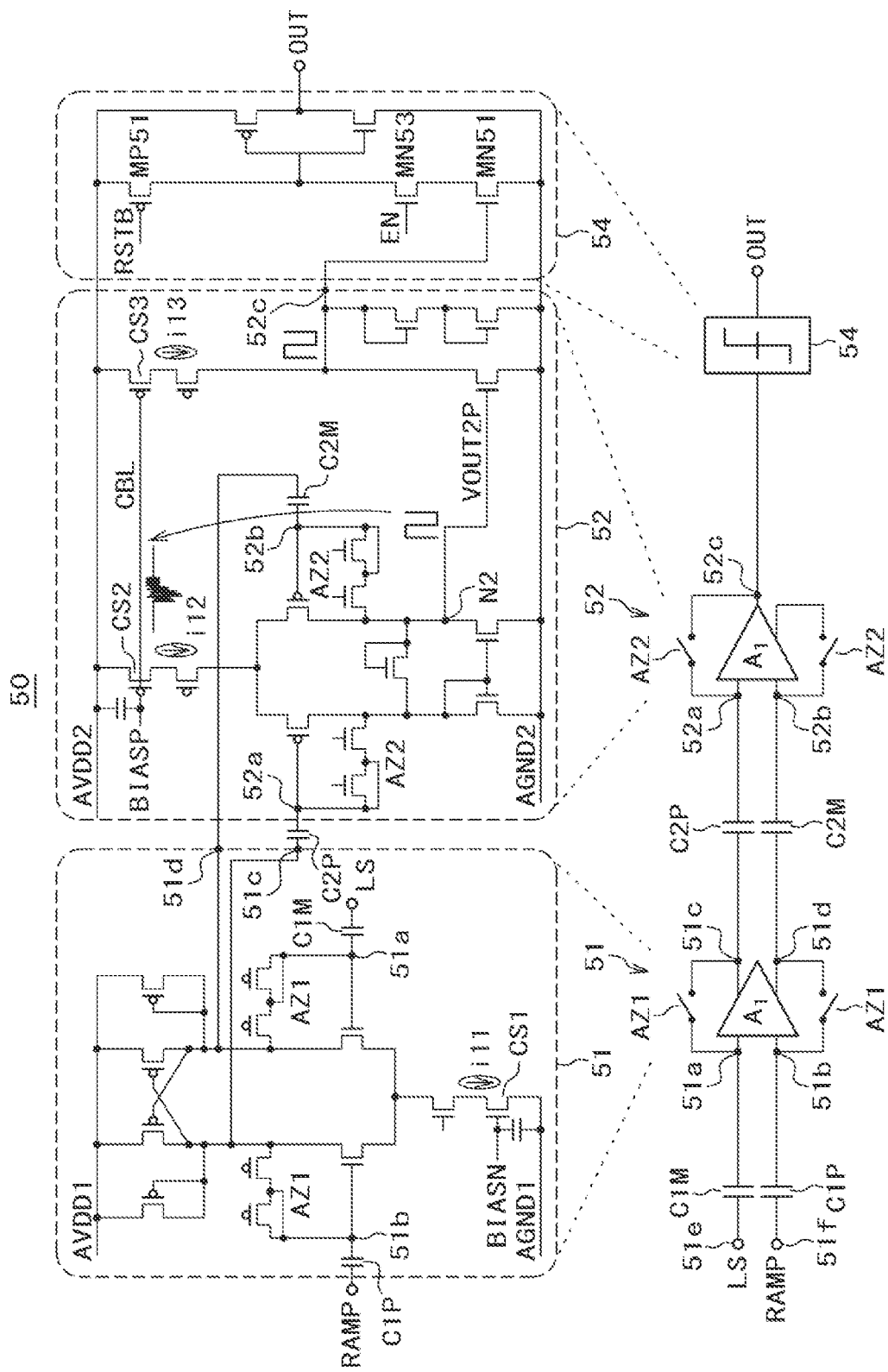
FIG. 15 is a configuration diagram illustrating the comparator.
Figure 16:
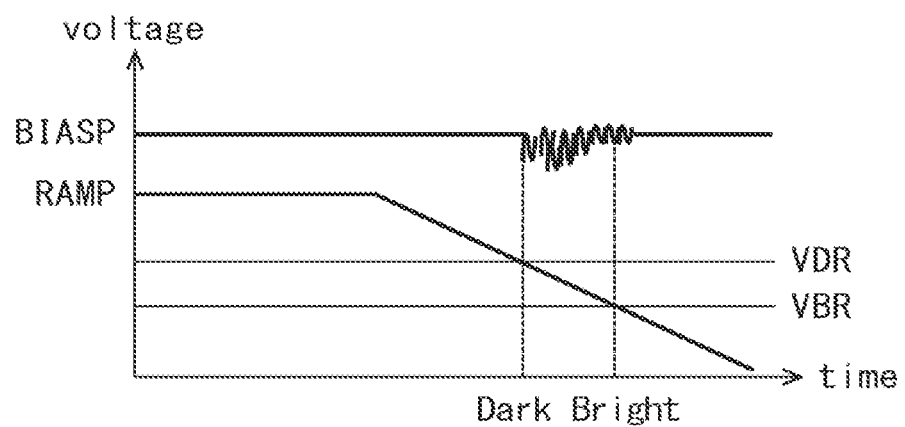
FIG. 16 is a diagram illustrating the operation principles of the integral type analog-to-digital converter.
Figure 17:
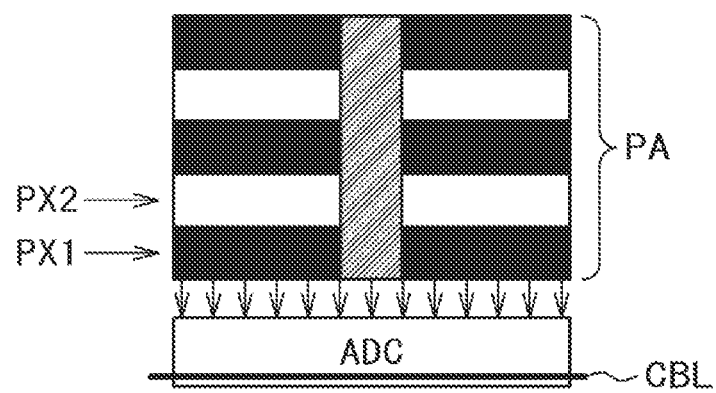
FIG. 17 is a diagram for explaining a problem in the comparator shown in FIG. 15.

In order to make the solid-state imaging device in the embodiment clearer, first, problems in the solid-state imaging device found by the present inventor will be described with reference to FIGS. 15 to 17. FIG. 15 is a configuration diagram illustrating the comparator. FIG. 16 is a diagram illustrating the operation principles of an integral type of analog-to-digital converter. FIG. 17 is a diagram for explaining a problem in the comparator shown in FIG. 15.

As described above, the solid-state imaging device comprises an analog-to-digital converter having the comparator. As shown in FIG. 15, a comparator 50 constituting the integral type of analog-to-digital converter compares a luminance signal (LS) outputted from a pixel and a ramp signal (RAMP) as the reference voltage. The comparator 50 comprises a first amplifier 51, a second amplifier 52 and a binarization circuit 54. In FIG. 15 shows an exemplary configuration in which the first amplifier 51 is configured with a fully differential amplifier and the second amplifier 52 is configured with a differential amplifier.

An input terminal 51a of the first amplifier 51 is connected to a terminal 51e the luminance signal (LS) outputted from the pixel via a capacitive element C1M is input. Further, an input terminal 51b of the first amplifier 51 is connected to a terminal 51f that the ramp signal (RAMP) is inputted via a capacitive element C1P.

Between an output terminal 51c of the first amplifier 51 and an input terminal 52a of the second amplifier 52 is connected via a capacitive element C2P. Further, an output terminal 51d of the first amplifier 51 and an input terminal 52b of the second amplifier 52 are connected via a capacitive element C2M.

The first amplifier 51 and the second amplifier 52 must first determine a judgment reference voltage of the comparative. The operation to determine this is referred to as initialization operation or the auto zero operation. Therefore, the auto zero operation for closing (turn off the switches) switches AZ1, AZ2 between the input and output terminals of the first amplifier 51 and between the input and output terminals of the second amplifier 52, independent of the external signal-DC level, to operate at an optimum operating point for the respective amplifier. The capacitive elements C1P, C1M, C2P, C2M are sampling capacities of an auto zero levels. Voltage corresponding to the luminance signal (LS) is generated by the capacitive element C1M. The capacitive element C1P generates a voltage corresponding to the ramp signal (RAMP). Voltage corresponding to an output voltage of the output terminal 51c is generated by the capacitive element C2P. Voltage corresponding to an output voltage of the output terminal 51d is generated by the capacitive element C2M.

An output terminal 52c of the second amplifier 52 is connected to the binarization circuit 54. The binarization circuit 54 includes a p-channel MOS (PMOS) transistor MP51, an n-channel MOS (NMOS) transistor MN51, and a NMOS transistor MN53. A control signal (RSTB) is input to the gate of PMOS transistor. Further, a gate of NMOS transistor MN51 is input to an output of the second amplifier 52. Further, the control signal (EN) is input to the gate of NMOS transistor MN51. The binarization circuit 54 includes an inverter circuit. Note that in the disclosed drawings, PMOS transistor is distinguished from NMOS transistor by 0.

In the first amplifier 51, the two input terminals 51a, 51b are constituted a differential comparator for NMOS transistor CS1 as a current source by two NMOS transistors connected to the gate. A source of the NMOS transistor CS1 is connected to the line to which a ground potential (AGND1) is supplied.

In the second amplifier 52, the two input terminals 52a, 52b are constituted a differential comparator that current source a PMOS transistor CS2 by two PMOS transistors connected to the gate. The source of the PMOS transistor CS2 is connected to the line to which a power supply potential (AVDD2) is supplied. The gate of NMOS transistor is connected to an output node N2 of the differential comparator. A PMOS transistor CS3 and the NMOS transistor are a source-ground amplifier circuit for inputting the gate electrode of NMOS transistor. The PMOS transistor CS3 is a loaded transistor that operates as a constant current source. The source of the PMOS transistor CS3 is connected to the line to which the power supply potential (AVDD2) is supplied.

Amplify A1 times at the first amplifier 51 of the first stage, and amplify A2 times at the second amplifier 52 of the second stage. Therefore, a large current flow through the PMOS transistor CS2 as a constant current source transistor of the second amplifier 52, and an output voltage (VOUT2P) of the output node N2 of the second amplifier 52 changes sharply. Consequently, noises ride on the common-bias line CBL that provide a bias voltage (BIASP) to the PMOS transistor CS2.

Incidentally, a current (i11) of the NMOS transistor CS1 as the constant current source transistor of the first amplifier 51 is smaller than a current (i12) of the PMOS transistor CS2 of the second amplifier 52. Also, the current (i11) is larger than a current (i13) of the PMOS transistor CS3 as the constant current source transistor. The magnitude of the current is an example and is not limited to this.

In the integral type analog-to-digital converter shown in FIG. 15, as shown in FIG. 16, the output of comparator 50 is inverted at a timing when the voltage of the ramp signal (RAMP) crosses the voltage of the luminance signal (LS) from the pixel. The operation time is earlier for a dark pixel because a voltage (VDR) of luminance signal (LS) of the dark pixel is higher than a voltage (VBR) of the luminance signal (LS) of a light pixel. That is, the operation time differs depending on the brightness. Therefore, the second amplifier 52 of the comparator 50 of the light pixel side is affected by the operation of the comparator 50 of the dark pixel side through the common-bias line CBL.

For example, as shown in an arrow PX1 of FIG. 17, when most of the row direction of a pixel array PA is dark and a portion of the central captures a bright subject, so that pixel signal having a similar value to a large number of the comparator for the dark pixel (black pixel) will be input. Therefore, the outputs of the comparator of a large number of the analog-to-digital converter ADCs are simultaneously inverted. This affects the light pixel (gray pixel) corresponding the comparator via the common-bias line CBL. A striped pattern appears in the light pixel (gray pixel).

On the other hand, as shown in an arrow PX2 of FIG. 17, when most of the row direction is bright and a portion of the central captures a dark subject, so that pixel signal having a similar value to a large number of the comparator for the light pixel (white pixel) is inputted. This results in simultaneous inversion of the outputs of multiple comparators. However, this simultaneous inversion takes place after the inversion operation of the comparator corresponding to the dark pixel (gray pixel). Therefore, it does not affect the comparator corresponding to the dark pixel (gray pixel).

When the outputs of a large number of the comparator are reversed simultaneously in this way, noise may occur due to current variations, etc., and affect the common-bias line CBL. In addition, current fluctuation during the analog-to-digital conversion period leads to an error. Then, such a problem becomes worse as the number of columns that are reversed simultaneously increases, so that the more pixel the effect increases. Although the second amplifier 52 has been described an example is differential type amplifier, even single-ended type amplifier using the common-bias line has the same problems.

Thus, in a solid-state image pickup device in which a plurality of the analog-to-digital converter operate in parallel, when the common-bias line is used for the second amplifier of the comparator constituting the analog-to-digital converter, noise is riding on the common-bias line was found as a problem. Such noises cause the bias voltage to fluctuate, and the performance of the solid-state imaging device cannot be improved.

Also, the number of analog-to-digital converter mounted on the solid-state imaging device is generally thousands, power reduction of the analog-to-digital converter is required. Therefore, we also propose the solid-state imaging device that reduces power dissipation.

The solid-state imaging device according to the embodiment will be described with reference to FIG. 1. FIG. 1 is a configuration diagram illustrating a solid-state imaging device according to an embodiment.

The solid-state imaging device 1 includes the pixel array (PA) 17, a control circuit (CTL) 10, a row select circuit (RSL) 11, a reference voltage generating circuit (RVG) 12 and a bias circuit (BIS) 13. Further, the solid-state imaging device 1 includes a counter circuit (CNT) 14, a horizontal transfer circuit (HTR) 15, a signal processing circuit (SIP) 16 and a plurality of analog-to-digital converters 18. The solid-state imaging device 1 is, for example, a CMOS image sensor.

The row select circuit 11 is controlled by the control circuit 10, in the pixel array 17 in which the plurality of pixels 19 are arranged in a matrix in a plurality of rows and the plurality of columns, sequentially selected one row by one to enable a control line 111 of the selected row.

The pixel array 17 includes a plurality of pixels 19. In the pixel array 17, a plurality of pixels 19 are arranged in a matrix consisting of a plurality of rows and the plurality of columns. The respective pixel 19 is activated in response to the corresponding plurality of control lines 111 being activated. Then, the enabled each pixel 19 outputs the luminance signal voltage of the voltage corresponding to the amount of an incident light to the corresponding a luminance signal line 197. The operation of pixels 19 is controlled by the control circuit 10.

In the pixel array 17, the video and screen images are photoelectrically converted for each pixel line, and the luminance signal (LS) is output to the analog-to-digital converter 18. The analog-to-digital converter 18 is provided with a plurality corresponding to the respective vertical signal line 197. For example, thousands are provided. It is arranged in the column in the image sensor and converts the luminance signal voltage outputted to the vertical signal line 197.

The analog-to-digital converter 18 is an integral type analog-to-digital converter and is arranged in the plurality of columns every vertical signal line 197. The analog-to-digital converter 18 includes comparators 20 and a latch 40. The comparator 20 compares the ramp signal (RAMP) generated by the reference voltage generating circuit 12 with the luminance signal (LS) obtained through the vertical signal line 197 from the pixel for each row line. The latch 40 holds the count result of the counter circuit 14 for counting the comparison time of the comparator 20. The output of each latch 40 is transferred to the signal processing circuit 16 via the horizontal transfer circuit 15. The specific configuration and function of the comparator 20 will be described in detail later.

In the analog-to-digital converter 18, the luminance signal (LS) read out to the vertical signal line 197 is compared to the ramp signal (RAMP), which is a linearly changing slope waveform with a slope of the comparator 20 arranged per column. At this time, the counter circuit 14 is operating, the potential of the ramp signal (RAMP) having a ramp waveform and the counter value changes while taking a one-to-one correspondence, converts the potential of the luminance signal (LS) to a digital signal. The change in the ramp signal (RAMP) converts the change in voltage into a change in time, and the voltage is converted into the digital value by counting the voltage at a certain cycle (clock). Then, when the luminance signal (LS) and the ramp signal (RAMP) intersect, the output of the comparator 20 is inverted, and holds the count value of the counter circuit 14 at that time in the latch 40, to complete the analog-to-digital conversion.

After the above analog-to-digital conversion period ends, the horizontal transfer circuit 15, data held in the latch 40 is input to the signal processing circuit 16, a two-dimensional image is generated by a predetermined signal processing.

Figure 2:
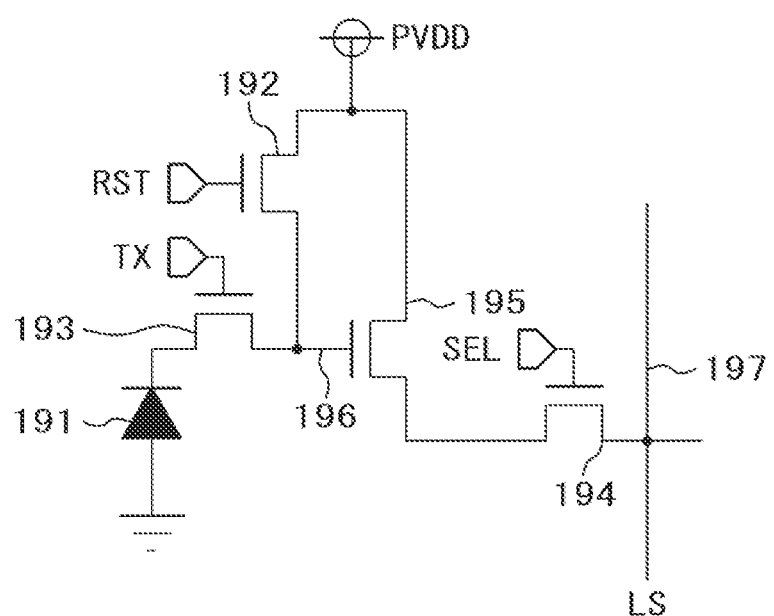
FIG. 2 is a block diagram illustrating pixel of the solid-state imaging device according to the embodiment.

The pixels 19 constituting the pixel array 17 shown in FIG. 1 will be described with reference to FIG. 2. FIG. 2 is a block diagram illustrating pixel of the solid-state imaging device according to the embodiment.

The pixel 19 includes a photoelectric conversion element photodiode 191, for example, four NMOS transistors. Four transistors are, for example, a reset transistor 192, a transfer transistor 193, a row select transistor 194, an amplifying transistor 195.

The reset transistor 192 resets a floating diffusion 196 to a predetermined voltage level in accordance with a reset control signal (RST). The transfer transistor 193, in accordance with a transfer control signal (TX), transmits an electrical signal generated by the photodiode 191. The row select transistor 194, in accordance with a row select signal (SEL), and outputs the luminance signal (LS) is an analog signal transmitted from the amplifying transistor 195 to the vertical signal line 197. The amplifying transistor 195 amplifies the potential of floating diffusion 196. Here, the reset control signal (RST), the transfer control signal (TX) and the row select signal (SEL) is supplied from the row select circuit 11 via the plurality of control lines 111.

The photodiode 191 photoelectrically converts the amount of electrons corresponding to the amount of light of the incident light. The transfer transistor 193, when the transfer control signal (TX) is at a high level (hereinafter, abbreviated as H level), an on state, transfers electrons photoelectrically converted by the photodiode 191 to the floating diffusion 196.

When the row select signal (SEL) is at the H level, the amplifying transistor 195 and the vertical signal line 197 is connected. The floating diffusion 196 is connected to the gate electrode of the amplifying transistor 195, constituting pixel current source and the source follower circuit. Thus, it outputs a voltage corresponding to the potential of the floating diffusion 196 to the vertical signal line 197.

More specifically, to initialize the photodiode 191 transfers the charge of the photodiode 191 to the floating diffusion 196 by the transfer transistor 193 is turned on the pixel 19 to the H level. Next, the pixel 19 is set to low level (hereinafter, abbreviated as L level) to turn off the transfer transistor 193, performs photoelectric conversion for a predetermined period, to accumulate charges.

At the time of reading, by setting the reset control signal (RST) to H level, the reset transistor 192 is conducted, the floating diffusion 196 is reset. Subsequently, by the row select signal (SEL) is H level, the row select transistor 194 is connected to the vertical signal line 197, the source follower circuit is configured. The reset control signal (RST) becomes L level, and the reset transistor 192 is turned off. The vertical signal line 197 is outputted the voltage value of the dark state prior to the charge from the photodiode 191 is transferred (also referred to as "Dark voltage.").

Next, the transfer control signal (TX) becomes H level, the transfer transistor 193 is conducted, the charge stored is photoelectrically converted by the photodiode 191 is transferred to the floating diffusion 196. The floating diffusion 196 changes in accordance with the transferred charges, and a voltage value (also referred to as a "Signal voltage") corresponding to the amount of pixel light is outputted to the vertical signal line 197.

By making the difference between Dark voltage and Signal voltage to be an image signal, so-called correlated double sampling (CDS: Correlated Double Sampling) operation can be performed to cancel out the effects of variations in the DC components of the pixel 19 and reset noise.

When the read of the pixel 19 is completed, the row select signal (SEL) becomes L level, the row select transistor 194 is turned off. These read operations are performed in parallel for one row of the pixels 19. The plurality of pixels 19 lined up in one row are read in parallel by the read operation. Therefore, the reset transistor 192, the transfer transistor 193, each reset control signals (RST) of the row select transistor 194, the transfer control signal (TX), the row select signal (SEL) are shared in rows.

Figure 3:
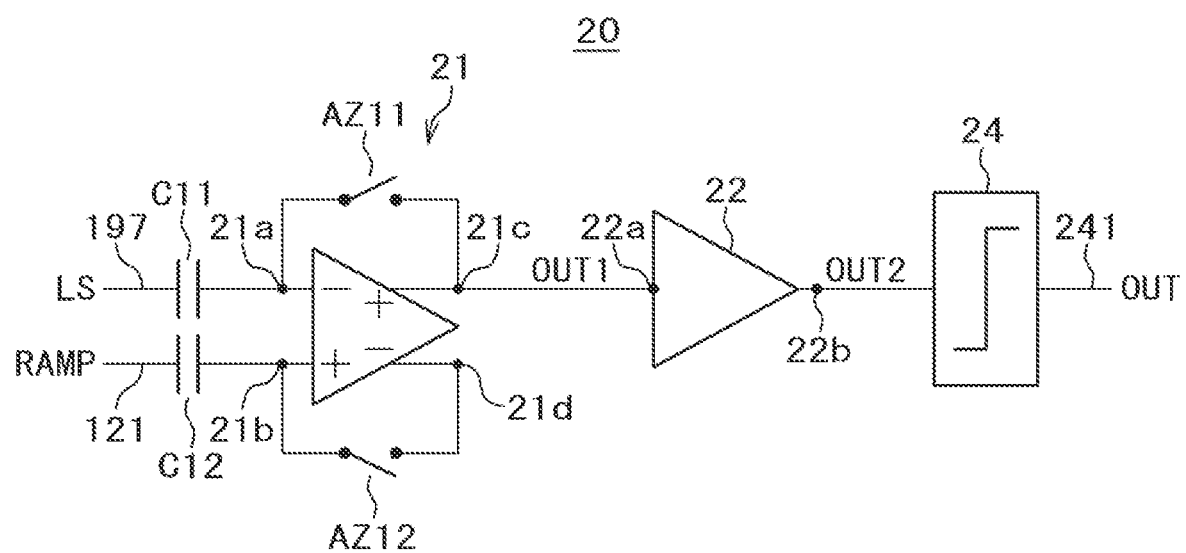
FIG. 3 is a block diagram illustrating a comparator shown in FIG. 1.

An outline of the comparator 20 will be described with reference to FIG. 3. FIG. 3 is a block diagram illustrating the comparator shown in FIG. 1.

The comparator 20 comprises a first amplifier 21, a second amplifier 22 and a binarization circuit 24. The comparator 20 compares the voltage of the luminance signal (LS) output from the pixel 19 to the vertical signal line 197 with the voltage of the ramp signal (RAMP) supplied to a reference voltage signal line 121. When the ramp signal (RAMP) is smaller, an output signal (OUT) at its output line 241 operates to output the H-level.

Between an output terminal 21c of the first amplifier 21 and an input terminal 21a and the first amplifier 21 is connected via a switch AZ11. Here, the input terminal 21a is also referred to as a negative input terminal or an inverted input terminal. The output terminal 21c is also referred to as a positive output terminal. Further, between an output terminal 21d of the first amplifier 21 and an input terminal 21b of the first amplifier 21 is connected via a switch AZ12. Here, the input terminal 21b is also referred to as positive input terminal or non-inverting input terminal. The output terminal 21d is also referred to as a negative output terminal. Therefore, by the auto zero operation of closing the switches AZ11, AZ12 between the input and output terminals of the first amplifier 21, the first amplifier 21 can be operated at the optimum operating point without depending on the external DC-level.

The input terminal 21a of the first amplifier 21 is connected to the luminance signal line 197 from the pixel 19 via a capacitive element C11. Thus, a voltage corresponding to the input voltage of the vertical signal line 197 is generated. Hereafter, this is referred to as the luminance signal voltage. The input terminal 21b of the first amplifier 21 is connected to the reference voltage signal line 121 via a capacitive element C12.

The output terminal 21c of the first amplifier 21 is connected to an input terminal 22a of the second amplifier 22 without passing through the capacitive element. An output terminal 22b of the second amplifier 22 is input to the binarization circuit 24.

Figure 4:
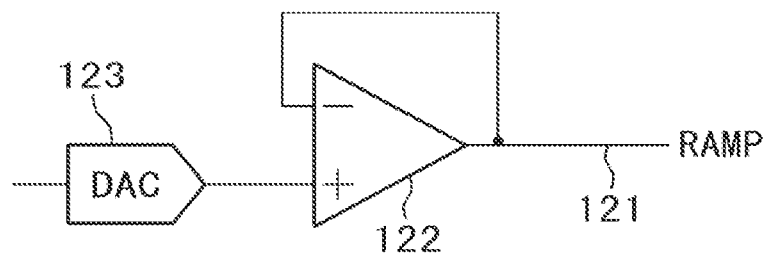
FIG. 4 is a circuit diagram illustrating an exemplary configuration of a reference voltage generating circuit shown in FIG. 1.
Figure 5:
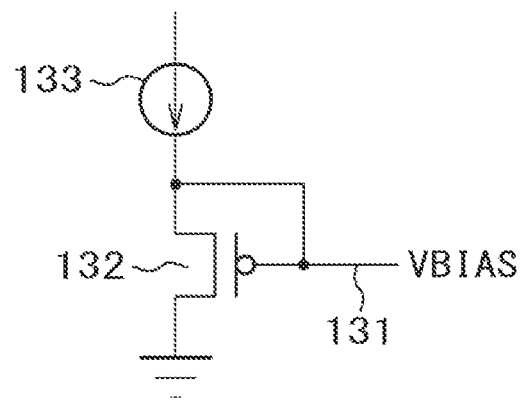
FIG. 5 is a circuit diagram showing an example of a configuration of a bias generating circuit shown in FIG.

It will be described with reference to FIGS. 4 and 5 for the reference voltage generating circuit 12 and the bias circuit 13. FIG. 4 is a circuit diagram illustrating an exemplary configuration of the reference voltage generating circuit shown in FIG. 1. FIG. 5 is a circuit diagram showing an example of a configuration of a bias generating circuit shown in FIG. 1.

As shown in FIG. 4, the reference voltage generating circuit 12 includes an operational amplifier 122 and a current DAC (Digital-to-Analog Converter) 123. A positive input terminal 122a of the operational amplifier 122 is short-circuited to the output terminal 122c, and the positive input terminal 122a is connected to the current DAC 123 controlled by the control circuit 10. The output terminal 122c is connected to the reference voltage signal line 121, and the reference voltage generating circuit 12 outputs the ramp signal (RAMP) as shown in FIG. 16. The reference voltage generating circuit 12 lowers the voltage of the ramp signal (RAMP) at a predetermined slope from a predetermined initial voltage.

As shown in FIG. 5, the bias circuit 13 includes a constant current source 133 and a PMOS transistor 132. The constant current source 133 is connected to the source and gate of the PMOS transistor 132 and outputs a bias voltage (VBIAS) to a bias signal line 131.

The counter circuit 14 shown in FIG. 1 is controlled by the control circuit 10 and is connected via a counter signal line 141 to the latch 40 of each analog-to-digital converter 18.

Figure 6:
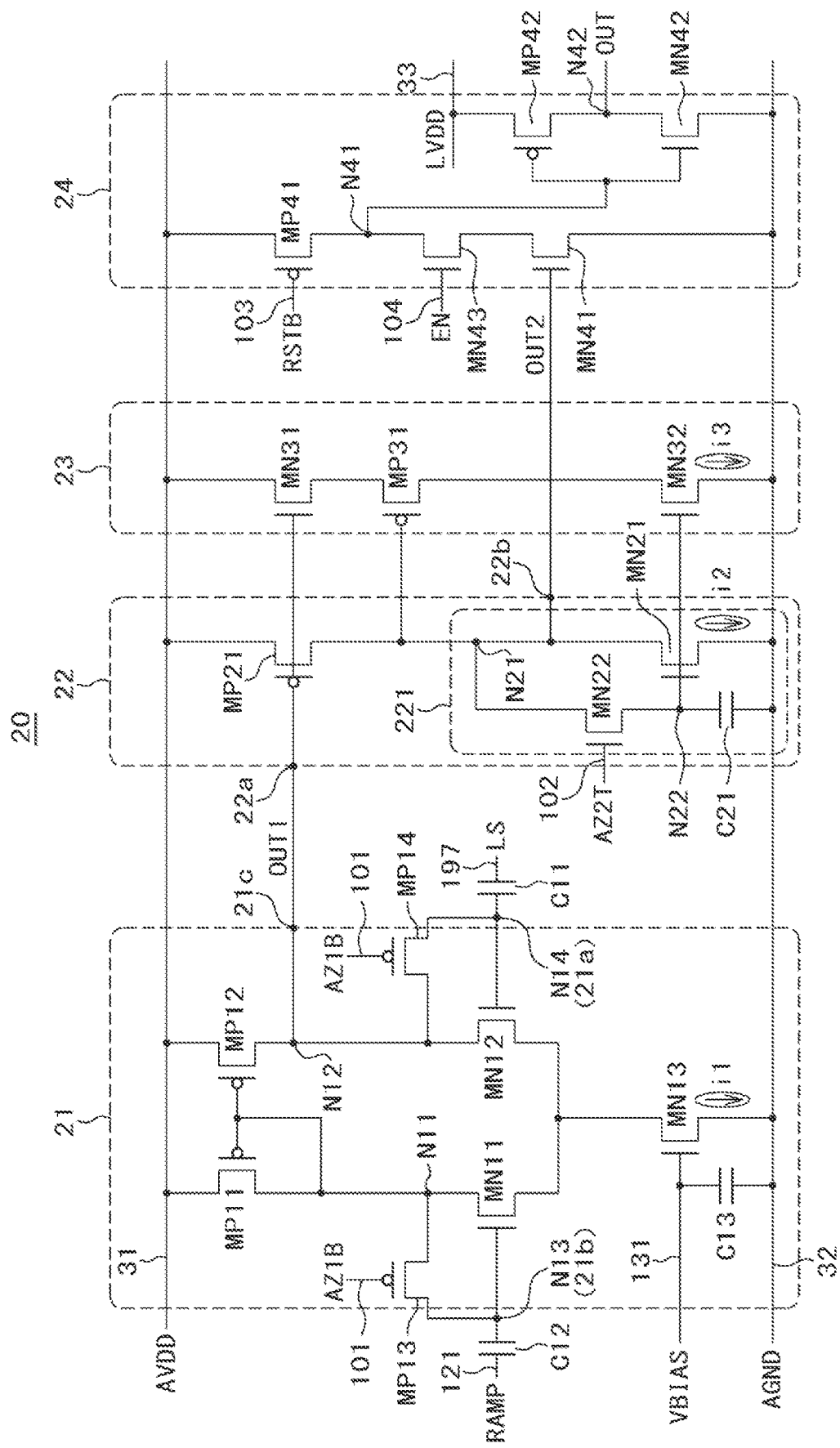
FIG. 6 is a block diagram illustrating an analog-to-digital converter shown in FIG. 3.

The configuration and function of the comparator 20 of the analog-to-digital converter 18 will be described with reference to FIG. 6. FIG. 6 is a block diagram illustrating the analog-to-digital converter shown in FIG. 3. In this embodiment, a first conductivity type is a p-channel or n-channel, and a second conductivity type is an n-channel or p-channel.

The first amplifier 21 includes PMOS transistors MP11 to MP14 and NMOS transistors MN11 to MN13. The first amplifier 21 serves as an amplifier for differential type to amplify the differential incoming voltages.

The source of the PMOS transistor MP11 and the source of the PMOS transistor MP12 are connected to a power supply line 31 to which a power supply potential (AVDD) is supplied. The drain of the PMOS transistor MP11 is connected to a drain of NMOS transistor MN11, a node N11 is formed by the connection point. Further, the drain and the gate of the PMOS transistor MP11 is connected, the connection point is connected to the gate of the PMOS transistor MP12. The drain of PMOS transistor MP12 is connected to a drain of NMOS transistor MN12, an output node N12 (output terminal 21c) of the first amplifier 21 by its connection point is formed.

A source of NMOS transistor MN11 and NMOS transistor MN12 are connected to each other, the connection point is connected to a drain of NMOS transistor MN13. A source of NMOS transistor MN13 is connected to a ground line (grounding conductor) 32 to which a reference potential or a ground potential (AGND) is supplied. The gate of NMOS transistor MN11 is connected to the first electrode of the capacitive element C12, a node N13 (input terminal 21b) is formed by the connection point. Then, the second electrode of the capacitive element C12 is connected to the reference voltage signal line 121 to the ramp signal (RAMP) is supplied. A gate of NMOS transistor MN12 is connected to the first electrode of the capacitive element C11, a node N14 (input terminal 21a) is formed by the connection point. Then, the second electrode of the capacitive element C11 is connected to the vertical signal line 197 to the luminance signal (LS) is supplied.

A gate of NMOS transistor MN13 is also connected to the bias signal line 131 and the first electrode of a capacitive element C13. Then, the second electrode of the capacitive element C13 is connected to the ground line 32.

A source of PMOS transistor MP13 is connected to the node N11 and the drain of PMOS transistor MP13 is connected to the node N13. A source of PMOS transistor MP14 is connected to the node N12 and the drain of PMOS transistor MP14 is connected to the node N14. A gate of PMOS transistors MP13, MP14 is commonly connected to a signal line to which a first AZ signal (AZ1B) is supplied. The first AZ signal (AZ1B) is an active signal at the L level and is supplied from the control circuit 10.

In the first amplifier 21 having such a configuration, the current mirror circuit is constituted by the PMOS transistors MP11, MP12. Further, a differential comparator that constitutes the NMOS transistor MN13 of current source is configured by the NMOS transistors MN11, MN12. Further, the PMOS transistors MP13, MP14 corresponds to the switches AZ11, AZ12 shown in FIG. 3, and functions as an auto zero switch (AZ switch). The capacitive elements C11 and C12 function as AZ-level sampling capacitance. Then, the output signal (VOUT1) of the first amplifier 21 is output from the output node N12 via the output terminal 21c to the second amplifier 22.

The second amplifier 22 includes a PMOS transistor MP21, NMOS transistors MN21, MN22, and a capacitive element C21 as an AZ-level sampling capacitance. The second amplifier 22 functions as a single-ended type of amplifier to amplify one input voltage. Then, a self-bias circuit 221 is constituted by the NMOS transistors MN21, MN22 and the capacitive element C21.

A source of PMOS transistor MP21 is connected to the power supply line 31, the gate of PMOS transistor MP21 is connected to the output terminal 21c of the first amplifier 21 via the input terminal 22a. A drain of PMOS transistor MP21 is connected to a drain of NMOS transistor MN21, a node N21 is formed by the connection point.

A source of NMOS transistor MN21 is connected to the ground line 32, a gate of NMOS transistor MN21 is connected to the first electrode of the capacitive element C21, a node N22 is formed by the connection point. The second electrode of the capacitive element C21 is connected to the ground line 32.

A drain of NMOS transistor MN22 is connected to node N21 and a source of NMOS transistor MN22 is connected to the node N22. A gate of NMOS transistor MN22 is commonly connected to a signal line to which a second AZ signal (AZ2T) is supplied. The second AZ signal (AZ2T) is a signal that is active at a high level and is supplied from the control circuit 10.

In the second amplifier 22 having such a configuration, the PMOS transistor MP21 is configured an amplifier circuit for inputting a gate. The PMOS transistor MP21 is also called an amplifier stage transistor. The NMOS transistor MN21 also functions as the constant current source. Also, the NMOS transistor MN22 functions as an AZ switch and the capacitive element C21 functions as an AZ-level sampling capacitance.

The auto zero operation of the first amplifier 21 will be described. To perform the auto zero operation, input the reset level (Dark voltage) to the vertical signal line 197, and input the initial voltage of the reference voltage generating circuit 12 to the reference voltage signal line 121.

The gate of PMOS transistor MP14 constituting the switch AZ11 and the gate of PMOS transistor MP13 constituting the switch AZ12 is supplied with the first AZ signal (AZ1B) for performing the auto zero operation in common. The PMOS transistors MP13, MP14 are turned on at the falling timing of the first AZ signal (AZ1B), and the first amplifier 21 is turned an auto zero state. When a gate-voltage of NMOS transistor MN11 and NMOS transistor MN12 equalizes, the operating point is determined and the circuit is balanced.

Subsequently, the PMOS transistors MP13, MP14 are turned off at the rising timing of the first AZ signal (AZ1B), and the gates of NMOS transistor MN11 and NMOS transistor MN12 both floats. At this time, the difference between the voltage of the vertical signal line 197 and the gate voltage of NMOS transistor MN12 is held at the capacitive element C11, the difference between the voltage of the reference voltage signal line 121 and the gate voltage of NMOS transistor MN11 is held at the capacitive element C12.

Figure 7:
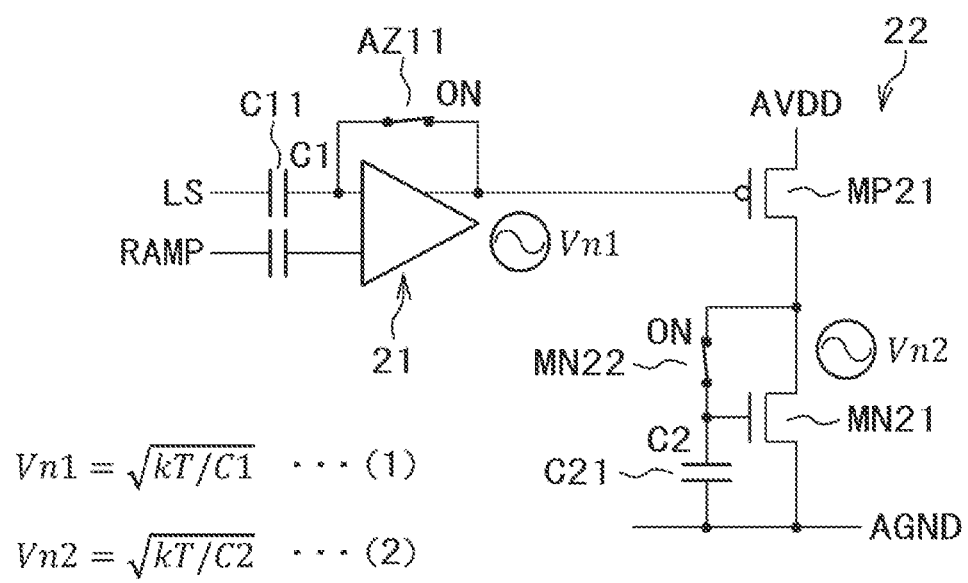
Figure 8:
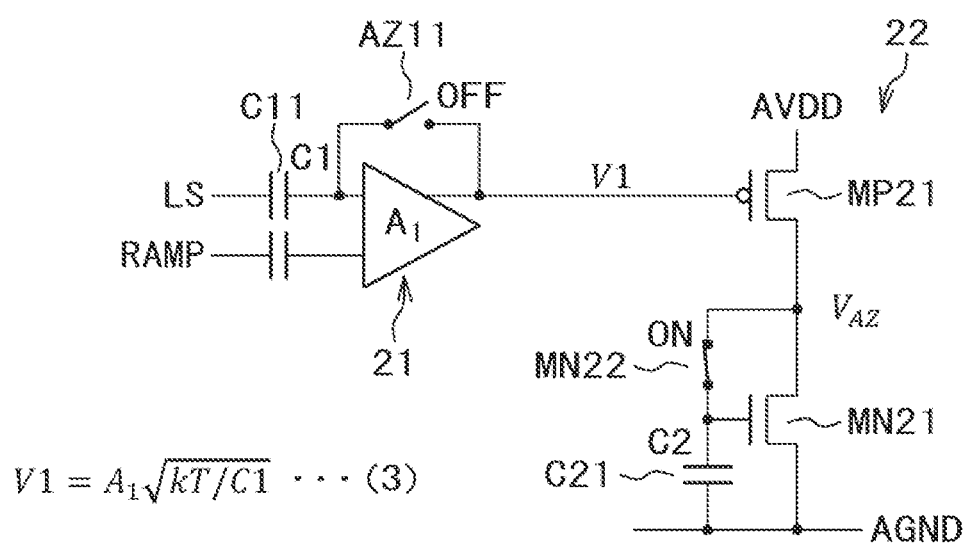
Figure 9:
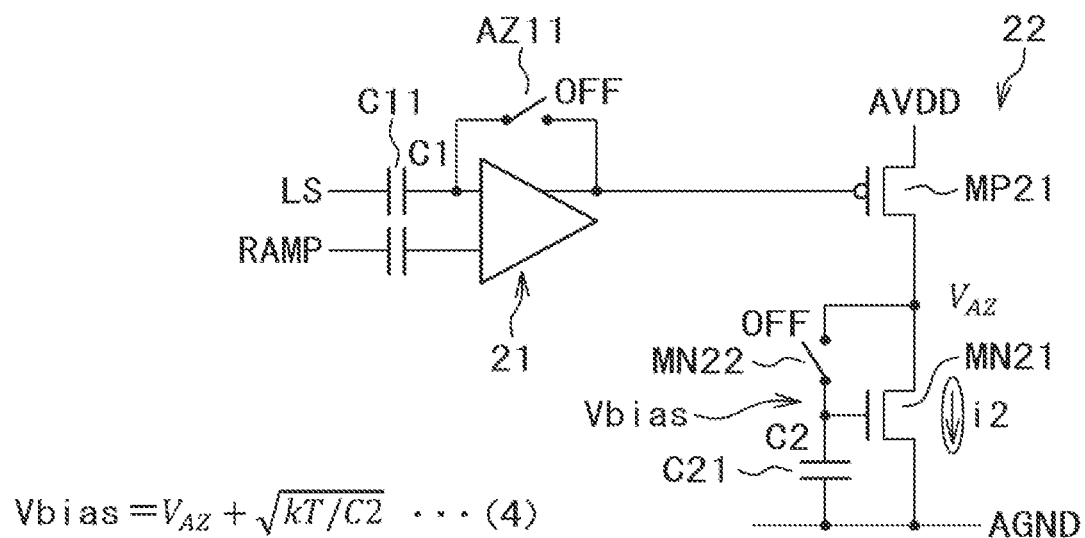
FIG. 9 is a diagram illustrating a state in which the AZ switch of the first amplifier and the second amplifier are turned off.

The auto zero operation and the self-bias circuit of the second amplifier 22 will be described with reference to FIGS. 7 to 9. FIG. 7 is a diagram illustrating a state in which the AZ switches of the first amplifier and the second amplifier are turned on. FIG. 8 is a diagram illustrating a state in which the AZ switch of the first amplifier is turned off and the AZ switch of the second amplifier is turned on. FIG. 9 is a diagram illustrating a state in which the AZ switches of the first amplifier and the second amplifier are turned off.

As shown in FIG. 7, the switch AZ11 as the AZ switch of the first amplifier 21 and the NMOS transistor MN22 as the AZ switch of the second amplifier 22 are turned on. When a noise voltage of the first amplifier 21 is Vn1 and the noise voltage of the second amplifier 22 is Vn2, the respective noise voltage is expressed by the equations (1) and (2) shown in FIG. 7. Where k is Boltzmann's constants, T is absolute temperature, C1 is the capacitance value of the capacitive element C11, and C2 is the capacitance value of the capacitive element C21.

As shown in FIG. 8, at time t1, when the switch AZ11 is turned off and the NMOS transistor MN22 is left on, the noise voltage Vn1 of the first amplifier 21 is stored in the capacitive element C11. An output voltage (V1) of the first amplifier 21 is represented by the equation (3) shown in FIG. 8. Where A1 is the gain of the first amplifier 21. Given VAZ of an operating point voltage of the second amplifier 22, VAZ is optimized with the noises of the first amplifier 21.

As shown in FIG. 9, at time t2 (>t1), while keeping the switch AZ11 off, when the NMOS transistor MN22 is turned off, the voltage below is stored and held in the capacitive element C21. When the voltage of the capacitive element C21 as a Vbias, it is expressed by the equation (4) shown in FIG. 9.

Therefore, the gate of NMOS transistor MN21 is supplied Vbias as a predetermined voltage, the constant current (i2) flows to the NMOS transistor MN21 when an output signal (OUT1) of the first amplifier 21 is L level. The self-bias circuit 221 is configured by the NMOS transistors MN21, MN22 and the capacitive element C21, the capacitive element C21 supplies a bias voltage (Vbias).

Since the output current value determined by the auto zero operation is held by the capacitive element C21 until after the output invert of the second amplifier 22, the resistance to the inversion point and processing variation of the second amplifier 22 is not deteriorated.

Figure 10:
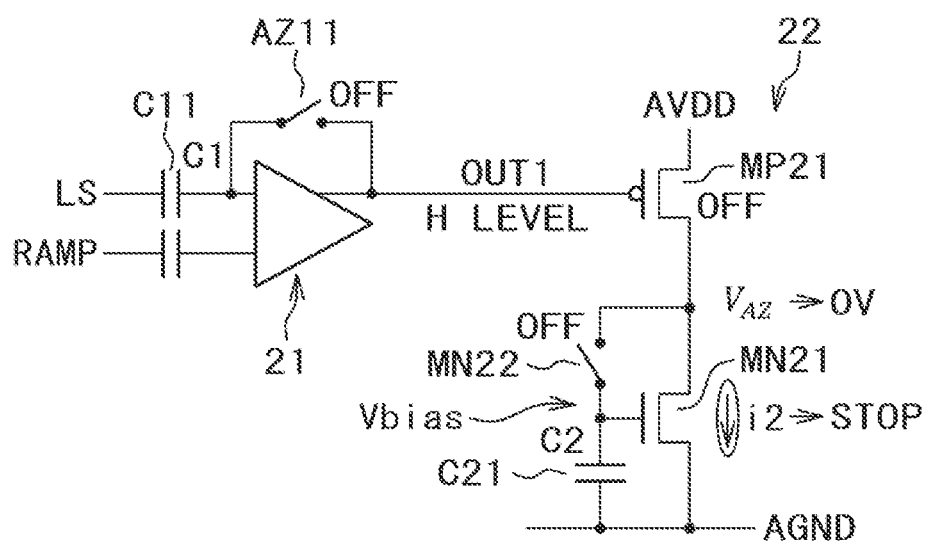
FIG. 10 is a diagram showing the state of the first amplifier and the second amplifier after an auto zero operation.
Figure 11:
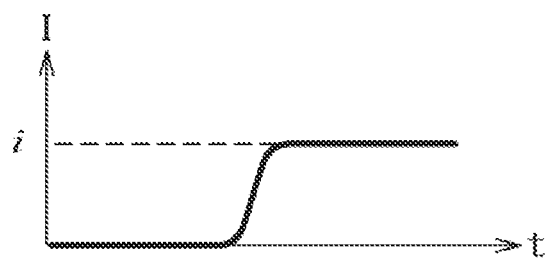
FIG. 11 is a diagram showing the current of the second amplifier.
Figure 12:
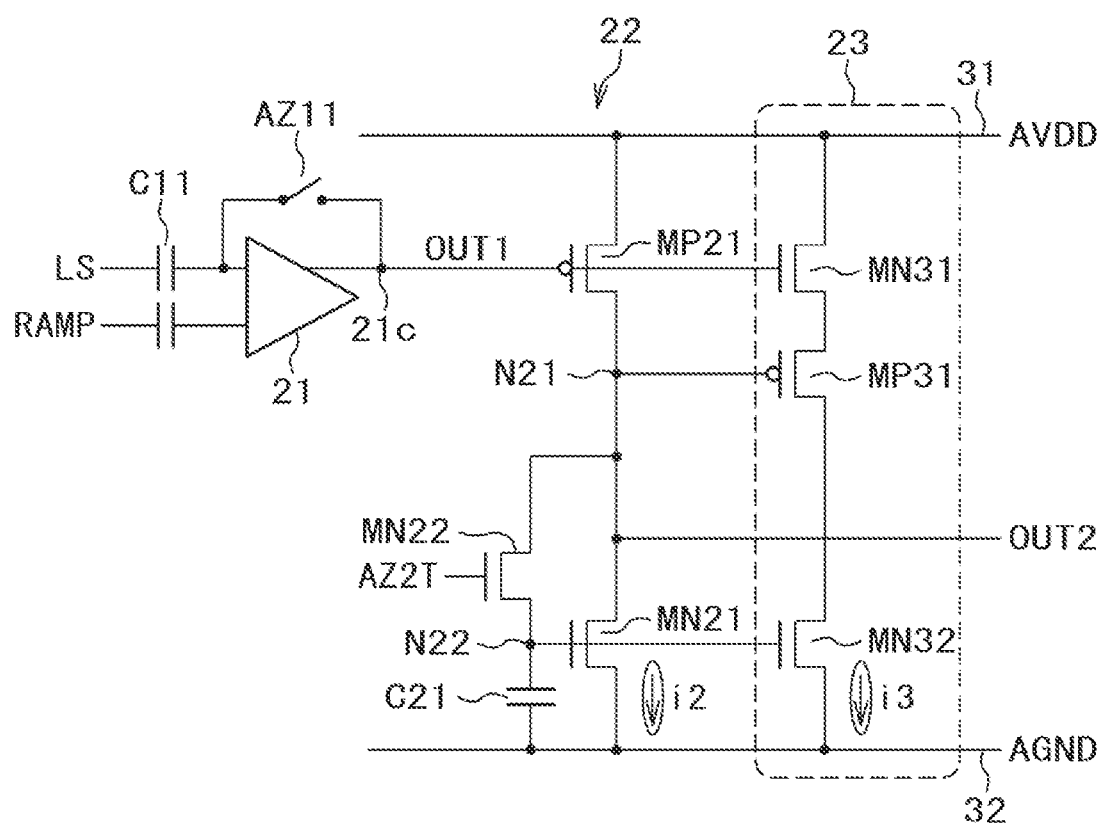
FIG. 12 is a diagram for explaining the configuration and operation of a current compensation circuit.
Figure 13:
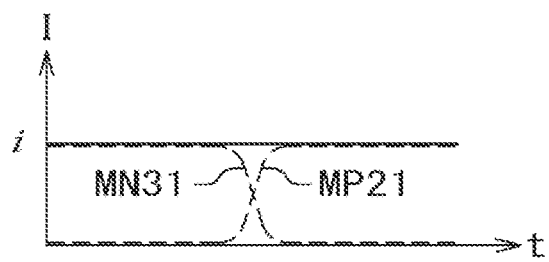
FIG. 13 is a diagram showing the current of the second amplifier and a current compensation circuit.

Next, the current compensation circuit will be described with reference to FIGS. 10 to 13. FIG. 10 is a diagram showing the state of the first amplifier and the second amplifier after the auto zero operation. FIG. 11 is a diagram showing the current of the second amplifier. FIG. 12 is a diagram for explaining the configuration and operation of the current compensation circuit. FIG. 13 is a diagram showing the current of the second amplifier and the current compensation circuit.

As shown in FIG. 10, the voltage of the ramp signal (RAMP) at the reference voltage signal line 121 is higher than the voltage of the luminance signal (LS) at the vertical signal line 197 in the initial state of analog-to-digital (AD) conversion. Therefore, the output signal (OUT1) of the first amplifier 21 is at H level, the input voltage of the second amplifier 22 is at H level. Therefore, since the PMOS transistor MP21 is in the off-state, an output signal (OUT2) of the second amplifier 22 is at the L-level. At this time, no current flows between the drain-source of NMOS transistor MN21.

When the voltage of the ramp signal (RAMP) in the reference voltage signal line 121 becomes smaller than the voltage of the luminance signal (LS) in the vertical signal line 197, the output signal (OUT1) of the first amplifier 21 is inverted to the L level. At this time, the PMOS transistor MP21 is turned on, the drain current of PMOS transistor MP21 flows through the NMOS transistor MN21 to stabilize the current. The second amplifier 22 can limit the current to constant current (i2), but cannot continue to flow at all times. Thus, the current change of the second amplifier 22 occurs before and after the output inversion of the first amplifier 21. Therefore, the so-called power supply level difference (rush current) in which the state of the analog power supply is different occurs, which causes an error in the analog-to-digital conversion.

Therefore, the second amplifier 22 is preferably added a current compensation circuit 23. The current compensation circuit 23 has a PMOS transistor MP31, NMOS transistors MN31, MN32. The NMOS transistor MN31 is reverse polarity of the amplifier stage transistor, and is also called a current switch transistor. The NMOS transistor MN32 is also called a current compensation transistor.

As shown in FIG. 12, in the current compensation circuit 23, a source of NMOS transistor MN31 is connected to the power supply line 31, a gate of NMOS transistor MN31 is connected to the output terminal 21c of the first amplifier 21. The NMOS transistor MN31 is reverse polarity to the PMOS transistor MP21. A drain of NMOS transistor MN31 is connected to a source of PMOS transistor MP31 and the gate of NMOS transistor MN31 is connected to the node N21 of the second amplifier 22. The NMOS transistor MN31 is connected to in series with the PMOS transistor MP31. A drain of PMOS transistor MP31 as a current switch is connected to a drain of the NMOS transistor MN32. A source of NMOS transistor MN32 is connected to the ground line 32 and a gate of NMOS transistor MN32 is connected to the node N22 of the second amplifier.

The PMOS transistor MP31 functions as the current switch to turn a current path on and off. A gate-level of PMOS transistor MP31 is controlled by the output signal (OUT2) of the second amplifier 22. When the output signal (OUT2) of the second amplifier 22 is L-level, the PMOS transistor MP31 is turned on, the constant current (i3) flows in the current compensation circuit 23. The PMOS transistor MP31 is turned off when the output signal (OUT2) of the second amplifier 22 exceeds the threshold voltage of PMOS transistor MP31, cutting the constant current (i3) flowing through the current compensation circuit 23.

If the output signal (OUT1) of the first amplifier 21 is H-level, the PMOS transistor MP21 is off and the NMOS transistor MN31 is on. At this time, no current flows in the second amplifier 22, the output signal (OUT2) of the second amplifier 22 is L-level. Therefore, the PMOS transistor MP31 is turned on and current flows through the current compensation circuit 23.

On the other hand, if the output signal (OUT1) of the first amplifier 21 is L-level, the PMOS transistor MP21 is on and the NMOS transistor MN31 is off. At this time, current flows through the second amplifier 22, the output signal (OUT2) of the second amplifier 22 is H-level. Therefore, the PMOS transistor MP31 is turned off, and no current flows through the current compensation circuit 23.

Therefore, as shown in FIG. 13, when the current flows through the second amplifier 22, the current does not flow to the current compensation circuit 23. And the current flows to the current compensation circuit 23, when the current does not flow to the second amplifier 22. That is, during a period in which the current of the second amplifier 22 before the start of amplification of the second amplifier 22 or after the completion of amplification stops, the current compensation circuit 23 flows the same amount of compensation current as the current flowing through the current source to the current compensation transistor. Thus, the current flows through one of the second amplifier 22 and the current compensation circuit 23, the current of the second amplifier 22 and the current compensation circuit 23 becomes constant, the power supply level difference is not generated. The current of the second amplifier 22 and the current of current compensation circuit 23 are same amount. The current of current compensation circuit 23 is also called a compensation current.

As shown in FIG. 6, the binarization circuit 24 includes PMOS transistors MP41, MP42 and NMOS transistors MN41, MN42, MN43. Then, the inverter circuit is constituted by the PMOS transistor MP42 and the NMOS transistor MN42.

A source of PMOS transistor MP41 is connected to the power supply line 31, and a gate of PMOS transistor MP41 is connected to a signal line 103 to which a reset signal (RSTB) is provided. A drain of PMOS transistor MP41 is connected to a drain of NMOS transistor MN43, a node N41 is formed by the connection point.

A source of NMOS transistor MN43 is connected to a drain of NMOS transistor MN41, and a gate of NMOS transistor MN43 is connected to a signal line 104 to which an enable signal (EN) is provided. A source of NMOS transistor MN41 is connected to the ground line 32 and the gate is connected to the output terminal 22b of the second amplifier 22.

A source of PMOS transistor MP42 is connected to a power supply line 33 to which a power supply potential (LVDD) is supplied, the gate is connected to the node N41. A drain of PMOS transistor MP42 is connected to a drain of NMOS transistor MN42, an output node N42 is formed by the connection point. A source of NMOS transistor MN42 is connected to the ground line 32 and the gate is connected to the node N41.

When the reset signal (RSTB) is at the L level, the PMOS transistor MP41 is turned on. Thus, the node N41 goes to the H level. When the reset signal (RSTB) becomes H level, the node N41 maintains the H level by holding the voltage to a parasitic capacitive element such as the wiring capacitance.

In analog-to-digital conversion, the binarization circuit 24 when the enable signal (EN) is H level is enabled. When the voltage of the output signal (OUT2) of the second amplifier 22, which is the input voltage of the binarization circuit 24, exceeds a threshold voltage of the NMOS transistor MN41, the NMOS transistor MN41 is turned on and the node N41 is pulled down to the L level. Therefore, the output signal (OUT) of the binarization circuit 24 is changed to H level thereby confirming the output. It should be noted that the output signal (OUT) outputs the H level and L level of the output signal (OUT) with the amplitude of power supply potential LVDD.

Incidentally, a current (i1) of the NMOS transistor MN13 as the constant current source transistor of the first amplifier 21 is smaller than the current (i11) of the NMOS transistor CS1 as the constant current source transistor of the first amplifier 51 shown in FIG. 6. For example, the current consumption of the first amplifier 21 with respect to 5 µA of the current consumption of the first amplifier 51 is 2.8 µA. Further, a current (i2) of the NMOS transistor MN21 as the constant current source transistor of the second amplifier 22 is very smaller than the current (i12) of the PMOS transistor CS2 as the constant current source transistor of the second amplifier 52 shown in FIG. 6. For example, the current consumption of the second amplifier 22 with respect to 25 µA of the current consumption of the second amplifier 52 is 0.7 µA. Further, a current (i3) of the NMOS transistor MN32 of the current compensation circuit 23 is comparable to the current (i2) of the NMOS transistor MN21, smaller than the current (i1) of the NMOS transistor MN13.

Figure 14:
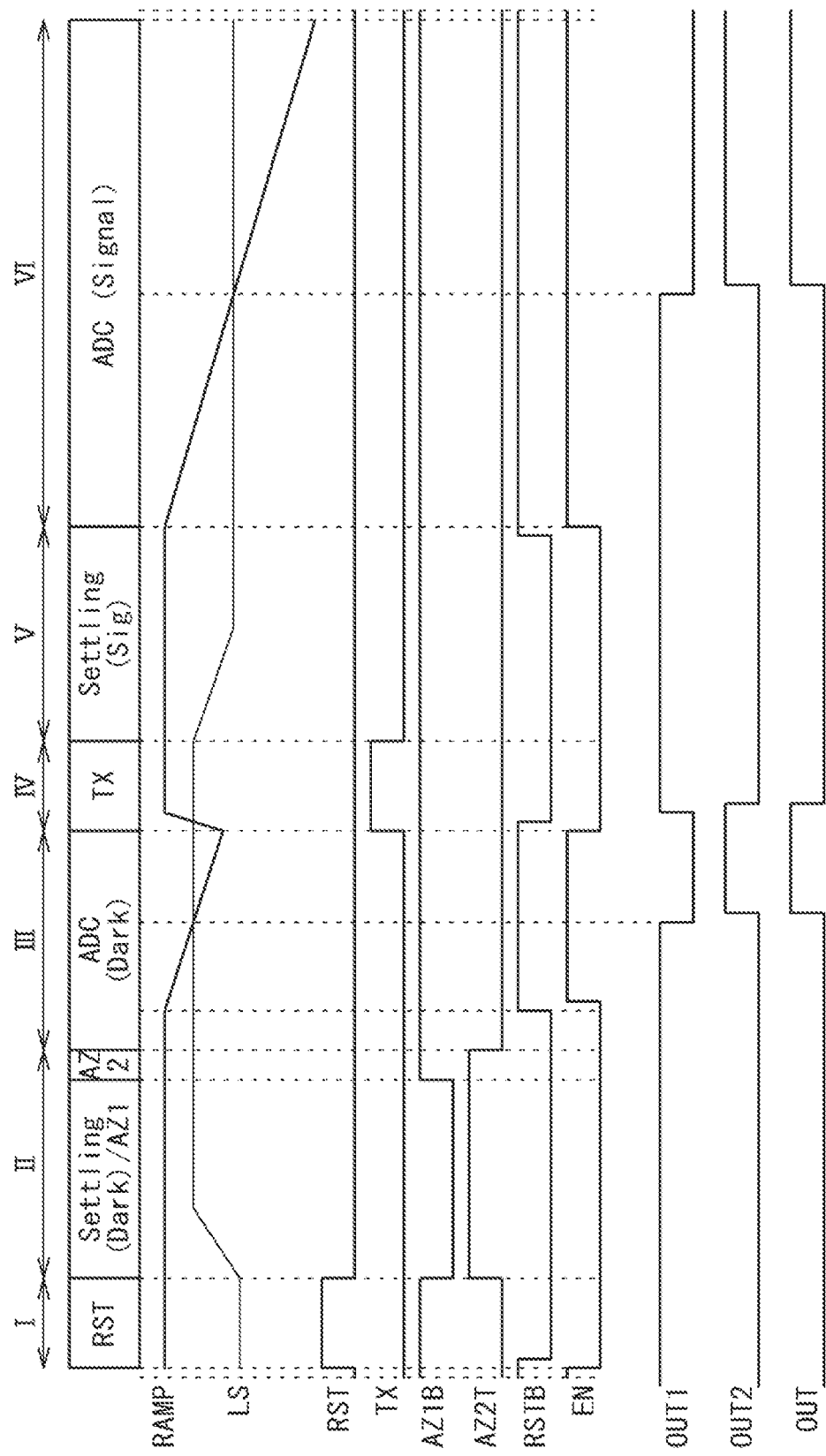
FIG. 14 is a timing diagram illustrating the operation of the comparator shown in FIG. 1.

Next, the operation of the analog-to-digital converter 18. FIG. 14 is a timing diagram illustrating the operation of the analog-to-digital converter shown in FIG. 1.

First, the details of each signal shown in FIG. 14 will be described. The period of the operation shown in FIG. 14 is a period required for one analog-to-digital conversion. The period of such operation can be divided into six phases, period I to period VI, depending on the operating conditions. The period I is a reset period (RST). The period II is the set period for Dark voltages. The period III is the analog-to-digital conversion period of Dark voltage. The period IV is a period for controlling by the transfer control signal (TX). The period V is a set period for Signal voltage. The period VI is the analog-to-digital conversion period of Signal voltage.

The ramp signal (RAMP) is swept in the analog-to-digital conversion period of Dark voltage (period III) and the analog-to-digital conversion period of Signal voltage (period VI), the other period holds a predetermined voltage (initial voltage). The luminance signal (LS) in the period II and the period III, the Dark voltage is output, in the period V and the period VI, the Signal voltage is output.

The reset control signal (RST) and the transfer control signal (TX) is a signal for controlling the pixel 19, in the period I, by activating (H level) the reset control signal (RST), the resetting of pixel 19. Further, in the period IV, it performs reading of Signal voltage by activating the transfer control signal (TX).

The first AZ signal (AZ1B), the second AZ signal (AZ2T) in the period II, performs the auto zero operation of the first amplifier 21 and the second amplifier 22 of the comparator 20. Initialize the first amplifier 21 and the second amplifier 22 by activating the first AZ signal (AZ1B) and the second Z signal (AZ2T). Here, the first AZ signal (AZ1B) is active at L level, and the second AZ signal (AZ2T) is active at H level. The active period of the second AZ signal (AZ2T) is longer than the active period of the second AZ signal (AZ1B).

The reset signal (RSTB), the enable signal (EN) is a signal for controlling the binarization circuit 24 in the comparator 20. The reset operation is performed when the reset signal (RSTB) is at the L level. The enable signal EN is enabled at the H level. The periods I, II, IV, and V, the reset, and the non-enable state, the analog-to-digital conversion period of Dark voltage (period III), the analog-to-digital conversion period of Signal voltage (period VI), the non-reset, the enable state.

The period I is the resetting period of the pixel 19. The analog-to-digital converter 18 does not require any particular operation.

The period II is the auto zero operation period of the comparator 20. In the first half of the Period II, close the switches AZ11 and AZ12 inserted between the input and output terminals of the first amplifier 21. That is, the first amplifier 21 of the input terminal 21a, and the output terminal 21c is connected in an on state, the input terminal 21b of the first amplifier 21, and the output terminal 21d is connected in an on state. Further, the node N21 of the second amplifier 22, and the node N22 is connected in an on-state.

In the second half of the Period II, open the switches AZ11 and AZ12 between the input and output terminals of the first amplifier 21. That is, the first amplifier 21 of the input terminal 21a, and the output terminal 21c is connected in an off state, the input terminal 21b of the first amplifier 21, and the output terminal 21d is connected in an off state. Further, the node N21 of the second amplifier 22, and the node N22 is connected in an on-state.

At the same time, a Dark voltage is applied to the vertical signal line 197 connected to the comparator 20 as the luminance signal (LS) from the pixel 19. The initial voltage as the ramp signal (RAMP) is applied to the reference voltage signal line 121 of the comparator 20.

It will be described in more detail below. In the comparator 20, in the first half of the period II, the first AZ signal (AZ1B) is supplied at the L level and the second AZ signal (AZ2T) is supplied at the H level. Thus, the PMOS transistors MP13, MP14 as the AZ switch of the first amplifier 21 is turned on. Similarly, the NMOS transistor MN22 as the AZ switch of the second amplifier 22 is turned on. This corresponds to the state shown in FIG. 7.

In the second half of the period II, the first AZ signal (AZ1B) is switched to the H level. Thus, the PMOS transistors MP13, MP14 as the AZ switch of the first amplifier 21 is turned off. This corresponds to the state shown in FIG. 8.

When the period II ends, the second AZ signal (AZ2T) switches to the L level. Thus, the NMOS transistor MN22 as the AZ switch of the second amplifier 22 is turned off. This corresponds to the state shown in FIG. 9.

In this manner, the analog-to-digital converter 18 uses the comparator 20 to first sample the initial voltage (offset level) of the reference voltage generating circuit 12, Dark voltage (reset level) of the pixel 19 and the AZ level for each column. These are stored in the capacitive elements C11 and C12, which are sampling capacitances of AZ-level. Offset levels of the first amplifier 21 and the second amplifier 22 store charges in the capacitive element C21.

The period III is the analog-to-digital conversion period of Dark voltage. Charges are accumulated in the second amplifier 22 of the capacitive element C21, the potential of the node N22 is a level that can conduct the NMOS transistor MN21 and the NMOS transistor MN32 of the current compensation circuit 23. At this time, as shown in FIG. 14, the output signal (OUT1) of the first amplifier 21 is H level, the output signal (VOUT2) of the second amplifier 22 is L level. This corresponds to the state shown in FIG. 10. Consequently, the NMOS transistors MN31, MN32 of the current compensation circuit 23 and the PMOS transistor MP31 as the current switch are held on-state. A minimum current flow through the NMOS transistor MN32.

In the first amplifier 21 of the comparator 20, in the period III, the gate-side nodes N13, N14 of NMOS transistors MN11, MN12 of the capacitive elements C11, C12 is the sampling capacitance accumulated during the auto zero operation is high-impedance (Hi-Z). Therefore, the gate input of the NMOS transistors MN11, MN12 constituting the differential transistor changes following the ramp-wave change of the ramp signal (RAMP) by the reference voltage generating circuit 12, and starts comparing the voltage level of the luminance signal (LS). Then, after the intersection of the ramp signal (RAMP) and the luminance signal (LS), the output signal (OUT1) of the first amplifier 21 changes steeply from H level (High level) to L level (Low level). The intersection of the ramp signal (RAMP) and the luminance signal (LS) is also called a comparison point.

As a result, the PMOS transistor MPT21 of the second amplifier 22 is turned on, a current starts to flow, and the output signal OUT2 of the second amplifier 22 changes from the L level to the H level. Here, the NMOS transistor MN21 is conductive, a minimum current flow. By the output signal (OUT2) of the second amplifier 22 changes from L level to H level, the PMOS transistor MP31 as the current switch of the current compensation circuit 23 is switched to the off-state. Thus, the current path of the current compensation circuit 23 is cut off, no current flows to the NMOS transistor MN32.

Period IV and period V is a read operation of the signal from the respective pixel 19, and a period for waiting for settling of Signal voltage. The analog-to-digital converter 18 prepares for Signal voltage-conversion, such as restoring the potential of the ramp signal (RAMP) of the reference voltage generating circuit 12 to its original.

The period VI is a period for performing analog-to-digital conversion of Signal voltage. The vertical signal line 197 continues to receive the luminance signal voltage from the pixel 19. In the movement of the period IV and period V on the pixel 19, the Signal voltage is entered instead of Dark voltage. In the period VI, the comparator 20 operates in the same manner as in the period III for every column.

According to the present embodiment, there are one or a plurality of effects described below.

(1) Noise is accumulated in the capacitive element C11 when the auto zero operation ends by turning off the switch AZ11 in the first amplifier 21. At this time, since the auto zero operation of the second amplifier 22 is performed, it is possible to ensure the correct operating point including the noise of the first amplifier 21. That is, the noise of the first amplifier 21 can be canceled.

(2) A self bias voltage can be set in the auto zero operation of the second amplifier 22. The use of the self bias voltage prevents kick-biasing through the common-bias line. Thus, analog-to-digital conversion error is reduced, it is possible to realize a high image quality.

(3) By providing the current compensation circuit in the second amplifier 22, the temporal change of the current can be eliminated. As a consequence, the analog-to-digital conversion error is reduced, and high image quality comparable to that of all differential amplifier can be achieved even with single-ended amplifier.

(4) Since the second amplifier 22 is a single-ended amplifier, it is possible to reduce the area and power dissipation.

(5) The power dissipation of the first amplifier 21 can be reduced because no capacitive element is connected to the output of the first amplifier 21.

Although the disclosure made by the disclosing person has been specifically described based on the embodiments, the present disclosure is not limited to the embodiments described above, and it is needless to say that various modifications can be made.

For example, the comparator, the polarity (conductivity type) of the transistor of the comparator 20 in the embodiment is configured as a reverse polarity (reverse conductivity type), the power supply potential and the ground potential to be connected may also be configured as a circuit-inverse.

What is claimed is:

1. An analog-to-digital converter, comprising:
   a comparator including a first amplifier and a second amplifier inputted one output of the first amplifier,
   wherein the first amplifier is a differential type of amplifier, and includes one input terminal for receiving a signal and the other input terminal for receiving a reference signal which changes with a predetermined slope,
   wherein the second amplifier is a single-ended type amplifier,
   wherein the second amplifier determine an auto zero voltage based on the amplified voltage by an auto zero operation of the first amplifier and includes a self-bias circuit using the auto zero voltage as a bias voltage, and
   wherein the comparator is plural, the comparators are plurality which arranged in a row direction, and outputs a digital value based on an analog voltage inputted to the other input terminal in parallel operation.

2. The analog-to-digital converter, according to claim 1, wherein the self-bias circuit includes a capacitive element for holding the auto zero voltage.

3. The analog-to-digital converter, according to claim 2, wherein a voltage holding electrode of the capacitive element is not connected to a voltage holding electrode of the capacitive element of the other comparator.

4. The analog-to-digital converter, according to claim 1, wherein the second amplifier includes an amplifier stage transistor and a current source,
   wherein the analog-to-digital converter further comprising a current compensation circuit which includes a current compensation transistor, and
   wherein the current compensation transistor is a reverse polarity to the amplifier stage transistor, and
   wherein the current compensation circuit flows a compensation current of the same amount as the current of the current source to the current compensation transistor, when the current does not flow to the second amplifier.

5. The analog-to-digital converter, according to claim 4, further comprising:

a current switch transistor connected is series to the current compensation transistor, and inputting an output of the second amplifier, wherein the current switch transistor is turned on or off the compensation current to the current compensation transistor based on the output of the second amplifier.

6. A current compensation circuit using with a single-ended type amplifier including an amplifier stage transistor and a current source, comprising:

a current compensation transistor which is a reverse polarity to the amplifier stage transistor, wherein the current compensation circuit flows a compensation current of the same amount as the current of the current source to the current compensation transistor, when the current does not flow to the single-ended type amplifier before a start of amplification or after completion of amplification of the single-ended type amplifier.

7. The current compensation circuit according to claim 6, further comprising:

a current switch transistor connected in series with the current compensation transistor, and inputting an output of the single-ended type amplifier, wherein the current switch transistor is turned on or off the compensation current to the current compensation transistor based on the output of the single-ended type amplifier.

8. A solid-state imaging device, comprising:

a pixel array in which a plurality of pixels for outputting a luminance signal voltage corresponding to the amount of incident light to a signal line is arranged in a matrix;

a reference voltage generating circuit outputting a reference voltage of the ramp signal of a predetermined slope to the ramp signal line;

an analog-to-digital converter for analog-to-digital conversion of the luminance signal voltage read the plurality of pixels from the pixel array; and a control circuit for controlling the analog-to-digital converter, wherein the analog-to-digital converter includes a plurality of comparators arranged each pixel line for column, compares the luminance signal voltage and the reference voltage, and outputs a signal of compared, wherein each comparator includes;

a first amplifier compared the luminance signal voltage with the reference voltage, and inverting an output at a predetermined comparison point; and a second amplifier formed a current path and outputting a gain-up of the output of the first amplifier, when the output of the first amplifier is inverted, wherein the control circuit determines an auto zero voltage of the second amplifier based on the voltage obtained by amplifying the voltage at the time of auto zero operation of the first amplifier.

9. The solid-state imaging device according to claim 8, wherein the first amplifier includes a first input terminal coupled to the signal line via a first capacitive element, a second input terminal coupled to the ramp signal line via a second capacitive element.

10. The solid-state imaging device according to claim 9, further comprising:

a first switch coupled to the first capacitive element; and
a second switch coupled to the second capacitive element;
wherein the second amplifier further including:

a first transistor of a first conductivity type in which the output of the first amplifier is input to the gate; and a second transistor of a second conductivity type coupled in series with the first transistor, including a third switch for determining the operating point for each column at the start of operation between the gate and the drain, and the gate of second transistor coupled to a third capacitive element, wherein the control circuit controls steps of:

(a) turning on the first switch, the second switch, and the third switch, (b) accumulating a noise voltage of the first amplifier to the first capacitive element and the second capacitive element by turning off the first switch and the second switch while turning on the third switch, amplifying the noise voltage accumulated in the first capacitive element and the second capacitive element by the first amplifier, and determining an operating point voltage of the second amplifier, and (c) turning on the third switch while the first switch and the second switch is turned off, and accumulating the noise voltage and the operating point voltage of the second amplifier in the third capacitor element.

11. The solid-state imaging device according to claim 10, further comprising:

a current compensation circuit flowing a current when a current does not flow to the second amplifier, wherein the current compensation circuit including:

a third transistor of the second conductivity type in which the output of the first amplifier is input to the gate;

a fourth transistor of the second conductivity type in which the third capacitor element is input to the gate, and coupled in series with the third transistor; and a fifth transistor of the first conductivity type arranged in a current path including the fourth transistor and the third transistor, wherein the fifth transistor is tuned on or off based on the output level of the second amplifier.

12. The solid-state imaging device according to claim 8, wherein the comparator further includes a binarization circuit for receiving the output signal of the second amplifier and outputting it as an output signal of the comparator.

13. The solid-state imaging device according to claim 10, wherein the first amplifier outputs a comparison output of a level at which the first transistor is turned off until intersection of luminance signal voltage and the reference voltage to the first transistor, and outputs the comparison output of a level at which the first transistor is turned on after the intersection to the first transistor.

* * * * *